United States Patent
Sy et al.

(10) Patent No.: US 12,058,834 B2
(45) Date of Patent: Aug. 6, 2024

(54) SEISMICALLY FORTIFIED ELECTRONIC EQUIPMENT RACKS

(71) Applicant: Dell Products L.P., Round Rock, TX (US)

(72) Inventors: Ben John Sy, Austin, TX (US); Tony P. Middleton, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 440 days.

(21) Appl. No.: 17/507,979

(22) Filed: Oct. 22, 2021

(65) Prior Publication Data

US 2023/0128822 A1 Apr. 27, 2023

(51) Int. Cl.
*H05K 7/14* (2006.01)
*F16B 7/18* (2006.01)

(52) U.S. Cl.
CPC ............. *H05K 7/1495* (2013.01); *F16B 7/18* (2013.01)

(58) Field of Classification Search
CPC .......... F16B 7/18; H05K 7/14; H05K 7/1495; H05K 7/18; H05K 7/183; H05K 7/186; H05K 7/20536; H05K 7/20709
USPC .................................................. 211/26, 189
See application file for complete search history.

(56) References Cited

U.S. PATENT DOCUMENTS

| | | | | |
|---|---|---|---|---|
| 2,932,368 A | * | 4/1960 | Schell, Jr. ............ | A47B 57/485 182/119 |
| 3,840,124 A | * | 10/1974 | Atwater ................... | F16B 7/044 211/183 |
| 3,928,905 A | * | 12/1975 | Atwater ................... | B65G 1/02 29/446 |
| 4,030,611 A | * | 6/1977 | Konstant .............. | A47B 57/485 211/182 |
| 4,088,229 A | * | 5/1978 | Jacoby ................... | A47B 91/00 211/183 |
| 4,124,123 A | * | 11/1978 | Armington .............. | B65G 1/02 211/186 |
| 4,954,007 A | * | 9/1990 | Pinney ................... | A47B 47/02 403/219 |
| 5,749,476 A | * | 5/1998 | Besserer ................ | H02B 1/301 211/189 |
| 6,036,290 A | * | 3/2000 | Jancsek ................. | H02B 1/301 312/265.3 |
| 6,142,594 A | * | 11/2000 | Benner .................... | H02B 1/01 312/258 |
| 6,213,577 B1 | * | 4/2001 | Rooyakkers ............ | H02B 1/30 312/265.3 |

(Continued)

OTHER PUBLICATIONS

Studweldingproducts. "Template Tube Adaptor." Youtube, Jun. 22, 2015. <https://www.youtube.com/watch?v=ZOoa8NWcsuQ> (Year: 2015).*

(Continued)

*Primary Examiner* — Joshua E Rodden
(74) *Attorney, Agent, or Firm* — Ryan, Mason & Lewis, LLP

(57) ABSTRACT

An electronic equipment rack includes a frame including a plurality of horizontal portions welded to a plurality of vertical portions, and a plurality of weld studs on surfaces of at least one of one or more of the plurality of vertical portions and one or more of the plurality of horizontal portions. One or more additional portions are attached to the frame via one or more of the plurality of weld studs.

20 Claims, 20 Drawing Sheets

(56) References Cited

U.S. PATENT DOCUMENTS

| | | | | |
|---|---|---|---|---|
| 6,293,637 | B1* | 9/2001 | Anderson | H02B 1/54 |
| | | | | 312/265.4 |
| 6,349,837 | B1* | 2/2002 | Serban | H05K 7/183 |
| | | | | 361/829 |
| 8,424,691 | B2 | 4/2013 | McMillan, III et al. | |
| 8,787,023 | B2* | 7/2014 | Lewis, II | B25B 5/104 |
| | | | | 361/829 |
| 8,901,418 | B2* | 12/2014 | Walker | H05K 7/1491 |
| | | | | 211/26 |
| 10,172,453 | B1* | 1/2019 | Redfern | A47B 47/00 |
| 10,610,013 | B2* | 4/2020 | Chen | F16B 12/08 |
| 10,772,222 | B2* | 9/2020 | Wang | H04Q 1/025 |
| 10,925,390 | B2* | 2/2021 | Reuter | A47B 47/0008 |
| 2002/0153335 | A1* | 10/2002 | Robideau | H05K 7/18 |
| | | | | 211/175 |
| 2004/0094496 | A1* | 5/2004 | MacDonald | B65G 1/02 |
| | | | | 211/183 |
| 2006/0213853 | A1* | 9/2006 | Schluter | H05K 7/186 |
| | | | | 211/189 |
| 2009/0283488 | A1* | 11/2009 | McMillan, III | H04Q 1/062 |
| | | | | 211/183 |
| 2010/0282133 | A1* | 11/2010 | Wong | B23K 37/0461 |
| | | | | 108/106 |
| 2022/0152810 | A1* | 5/2022 | Gambino | B25H 1/08 |

OTHER PUBLICATIONS

Chatsworth Products, "Z4-Series SeismicFrame Cabinet System," https://www.chatsworth.com/en-us/products/cabinets-enclosures-containment/network-cabinets/critical-facilities/z4-series-seismicframe-cabinet-system?sourcecall=googleads&insitesid=1454&gclid=EAlalQobChMImt7ViuHJ8gIVDm-GCh0z4QAaEAAYASAAEgL0ifD_BwE, Accessed Aug. 24, 2021, 16 pages.

Midwest Fasteners, Inc. "What is Stud Welding?" https://www.midwestfasteners.com/stud-welding/?gclid=CjwKCAjw2bmLBhBREiwAZ6ugo-H5AW6jCf1-qsZJn0ZWWqLbT3uieY76O1gF4daL9wgmUs%E2%80%A6, Accessed Oct. 20, 2021, 7 pages.

Telcordia, "NEBS Requirements: Physical Protection," Telcordia Technologies Generic Requirements, GR-63-Core, Issue 3, Mar. 2006, 173 pages.

Chatsworth Products, Inc. "Seismic Frame Two-Post Rack," https://www.chatsworth.com/en-us/products/racks-cable-management/two-post-racks/seismic-protection/seismic-frame-two-post-rack. Accessed Oct. 22, 2021, 9 pages.

Chatsworth Products, Inc. "Seismic Frame Cabinet System," Product Information Sheet, www.chatsworth.com, 2009, 1 page.

Chatsworth Products, Inc. "Seismic Frame Cabinet System," Frequently Asked Questions, www.chatsworth.com, 2010, 2 pages.

* cited by examiner

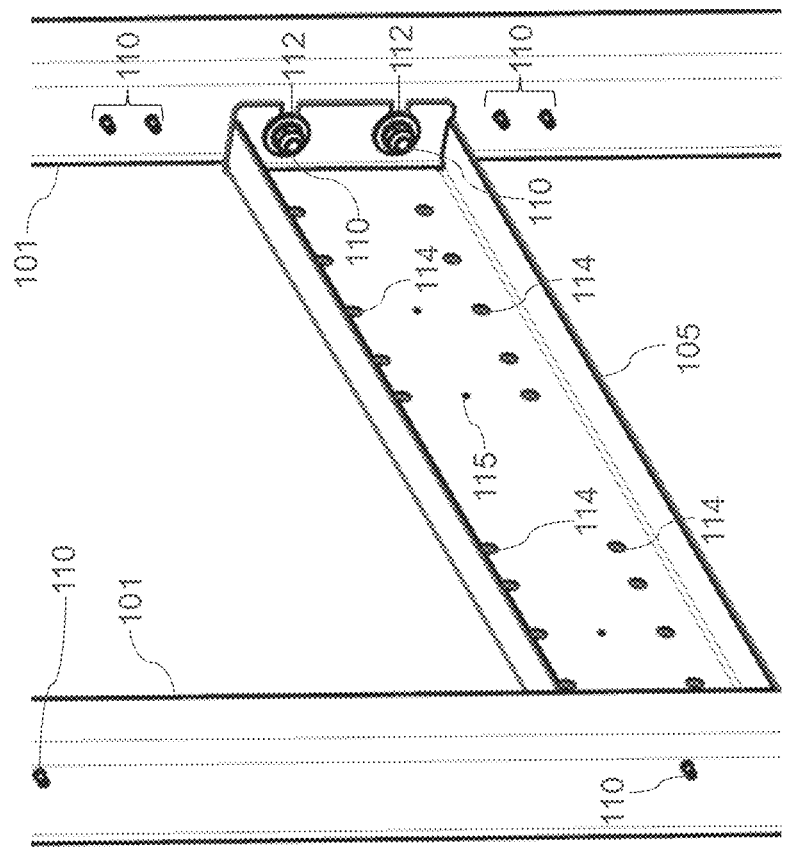
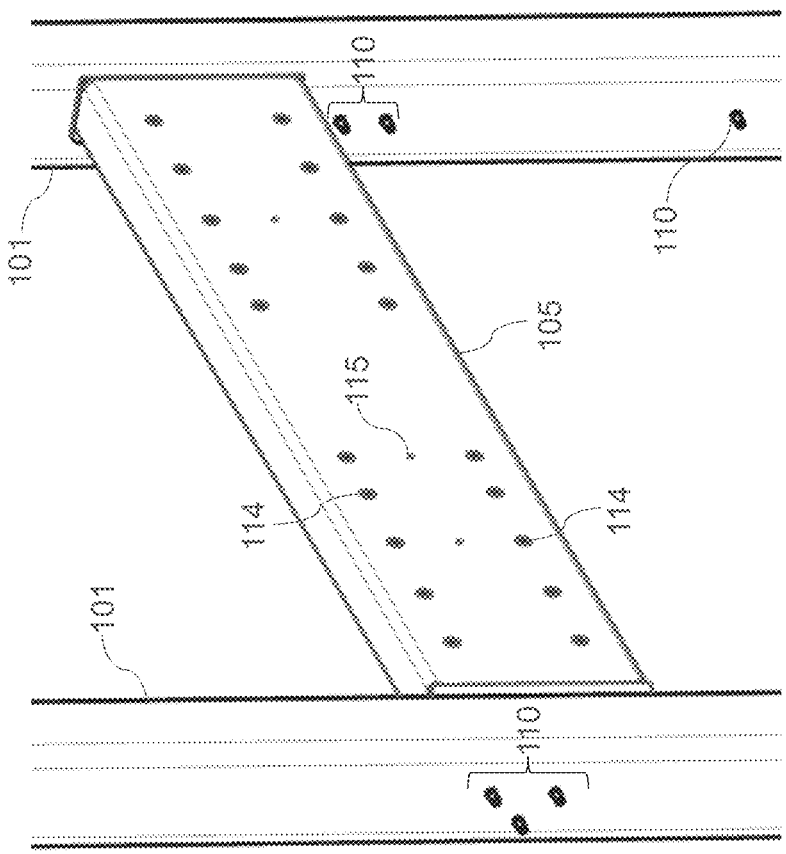
FIG. 1B

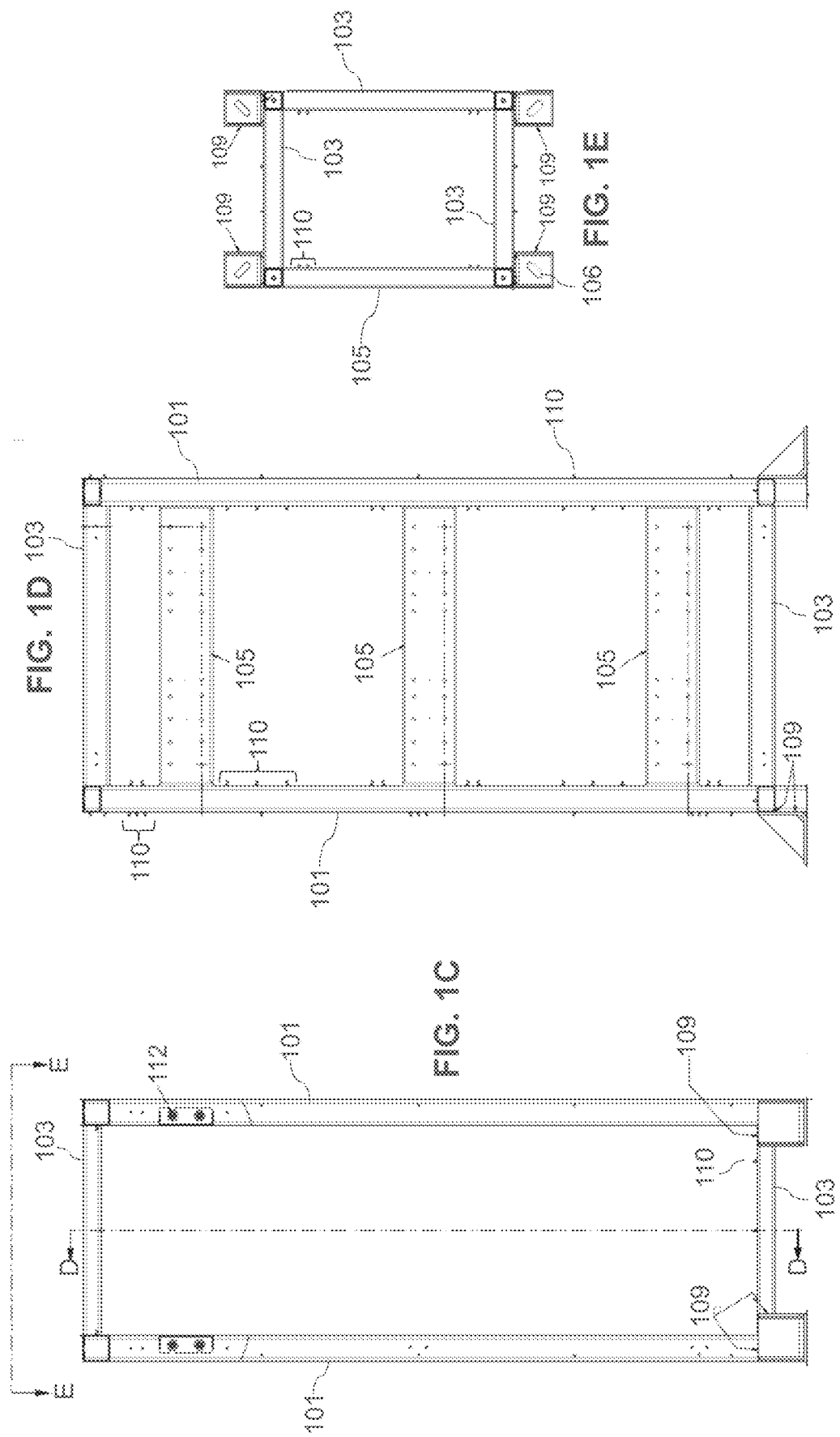

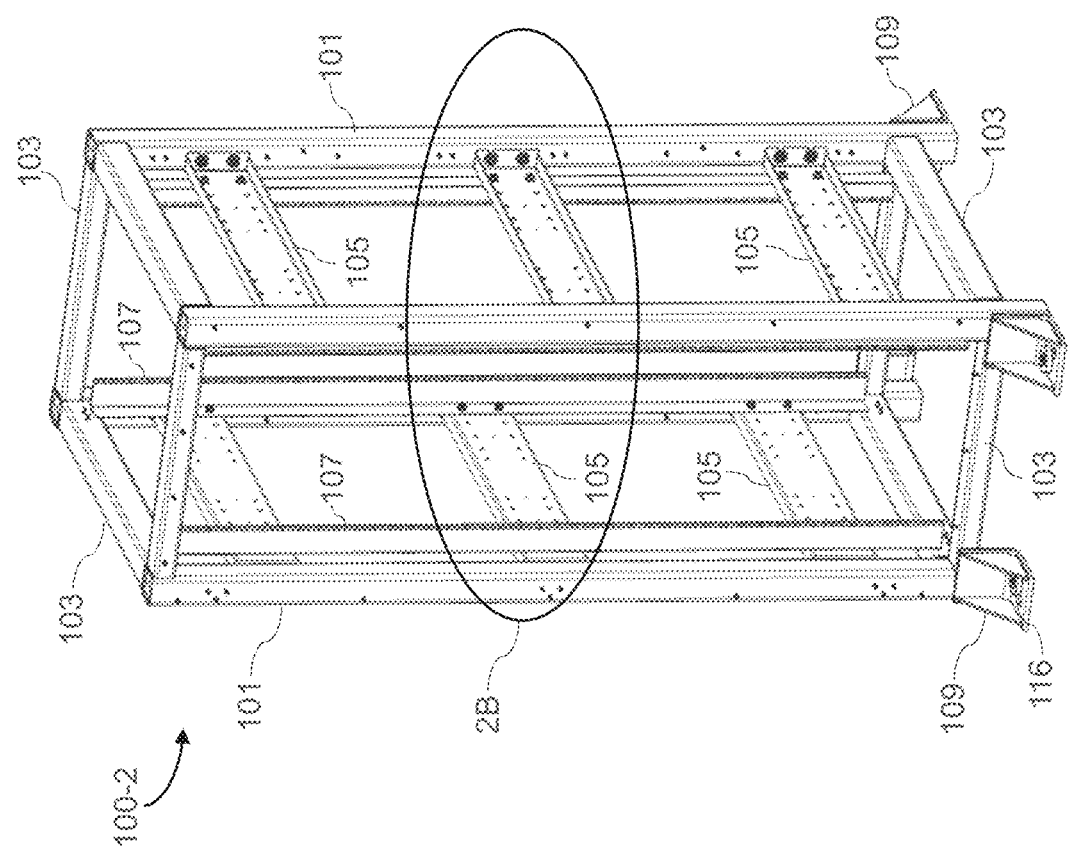

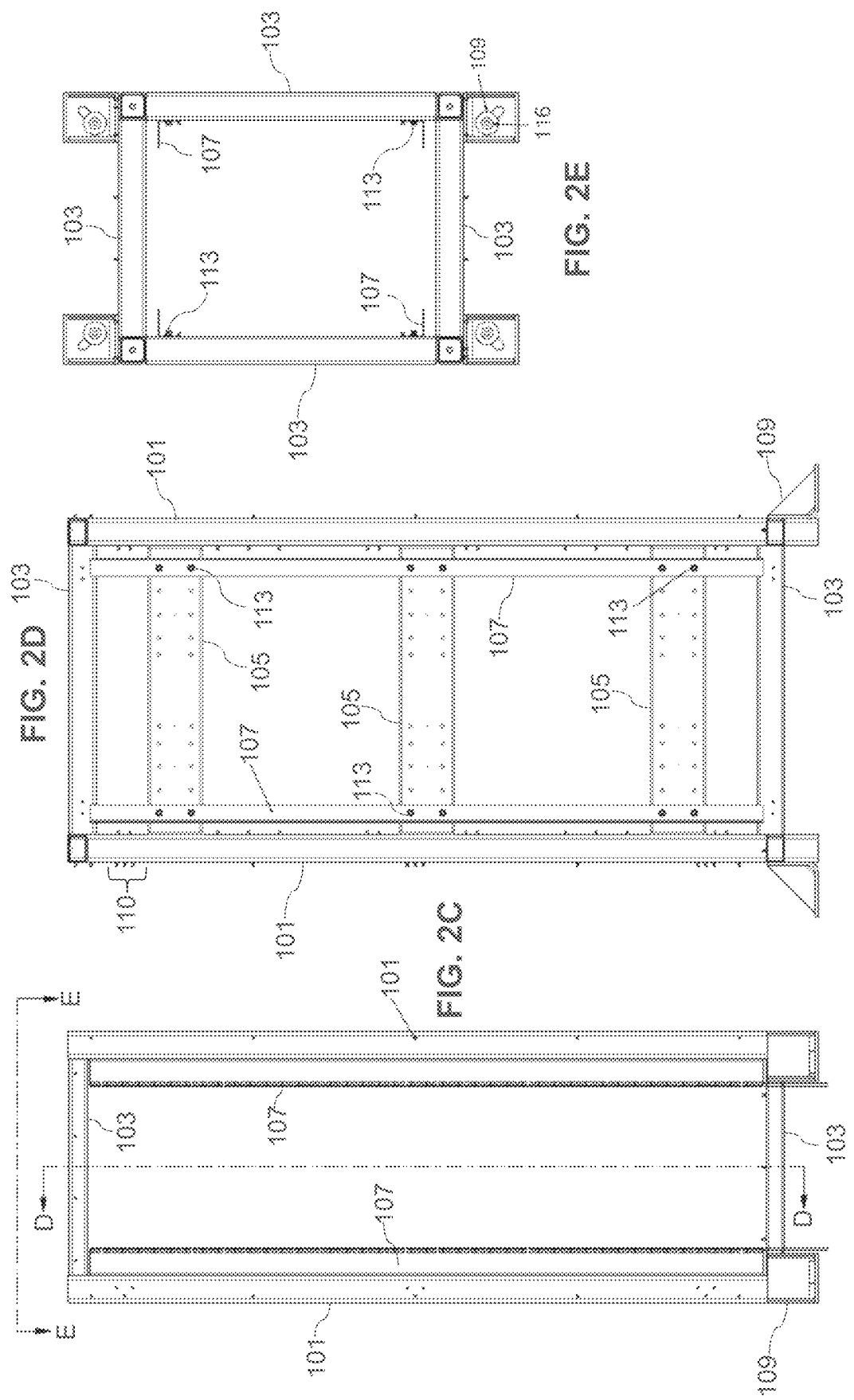

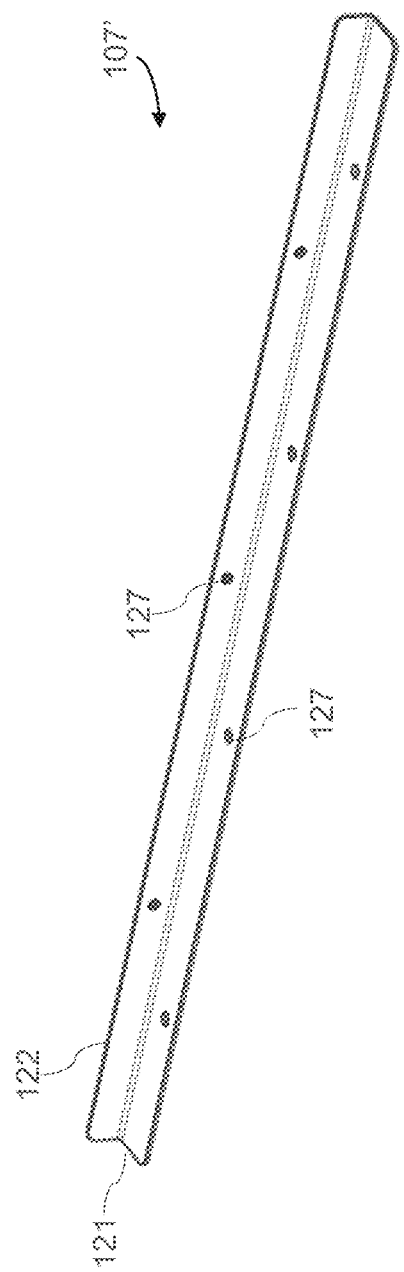

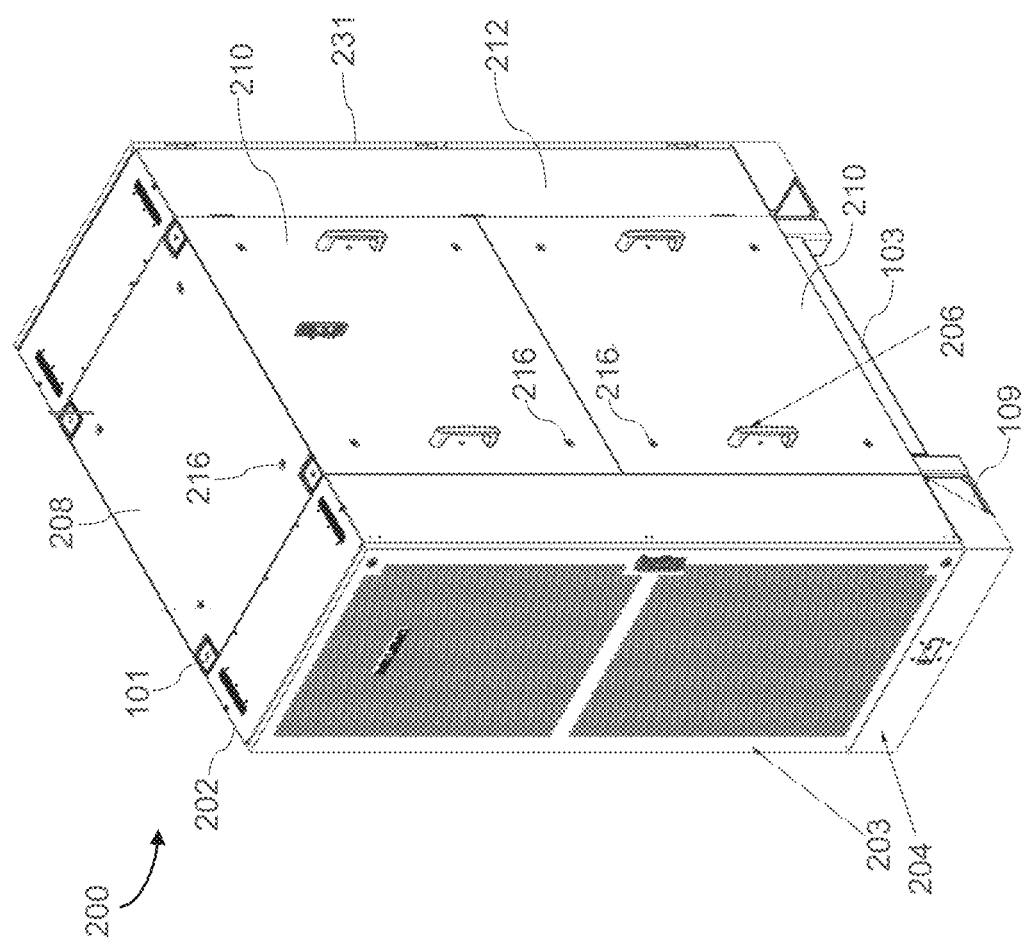

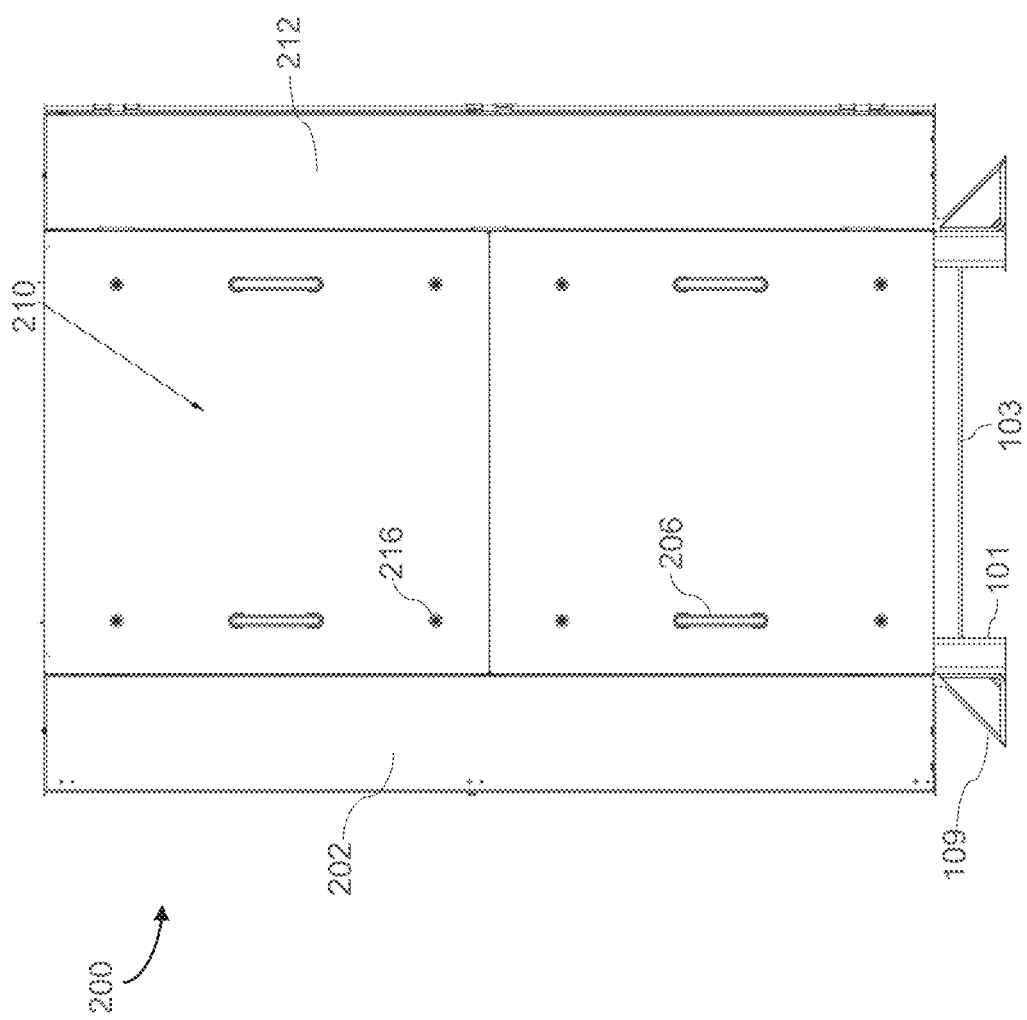

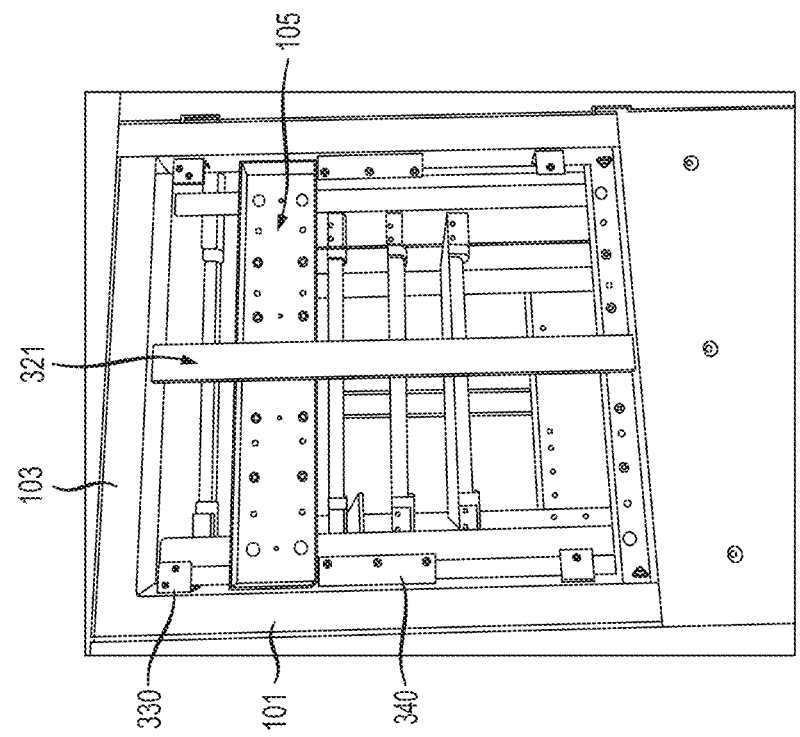
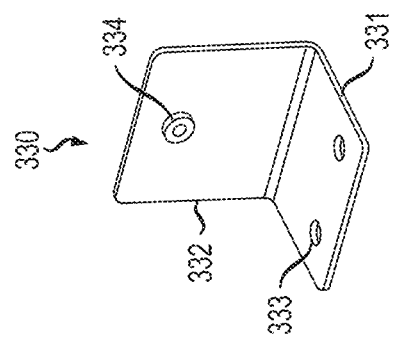
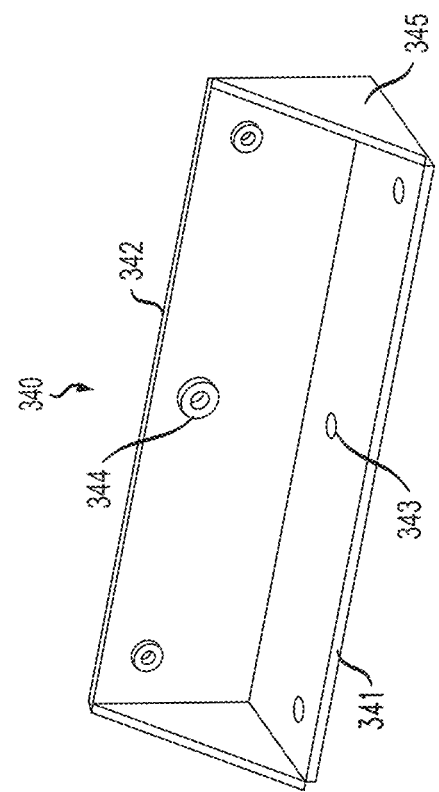

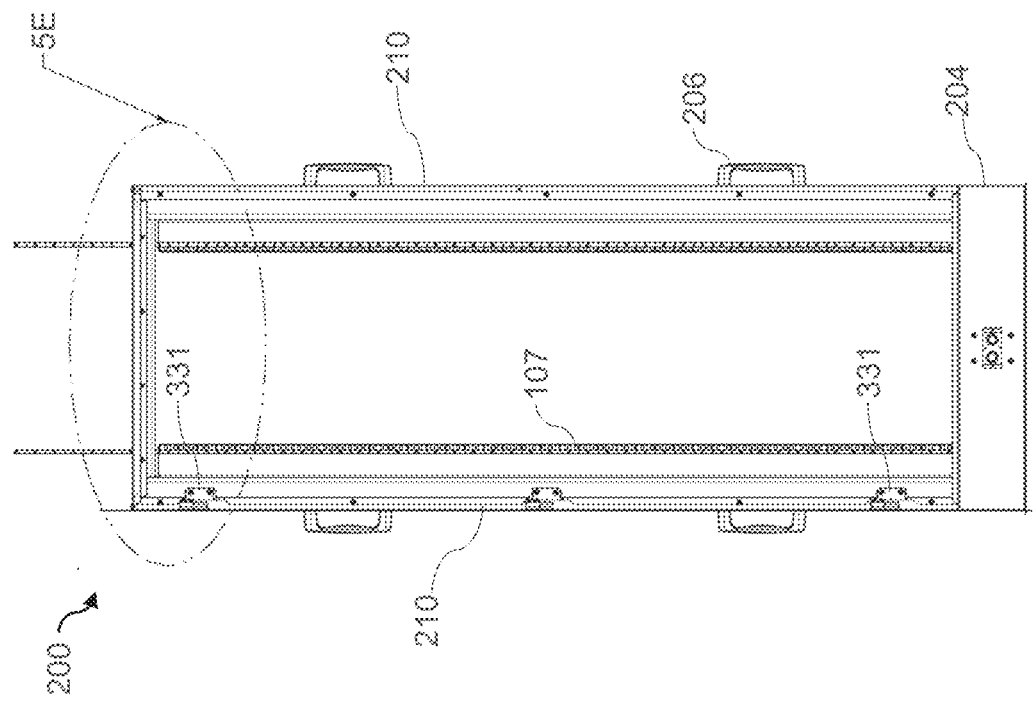

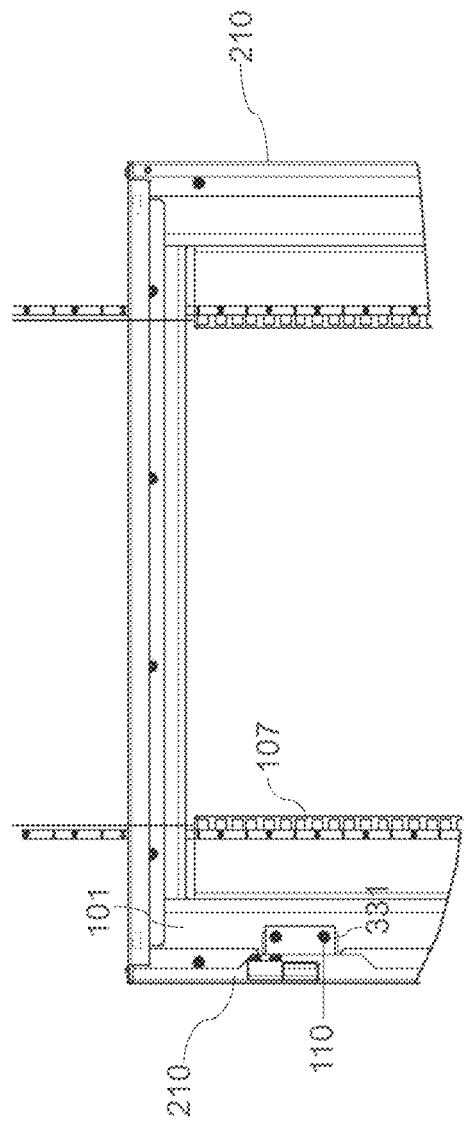

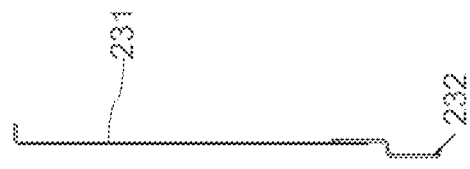
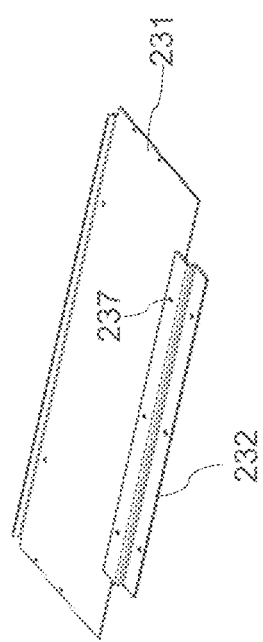
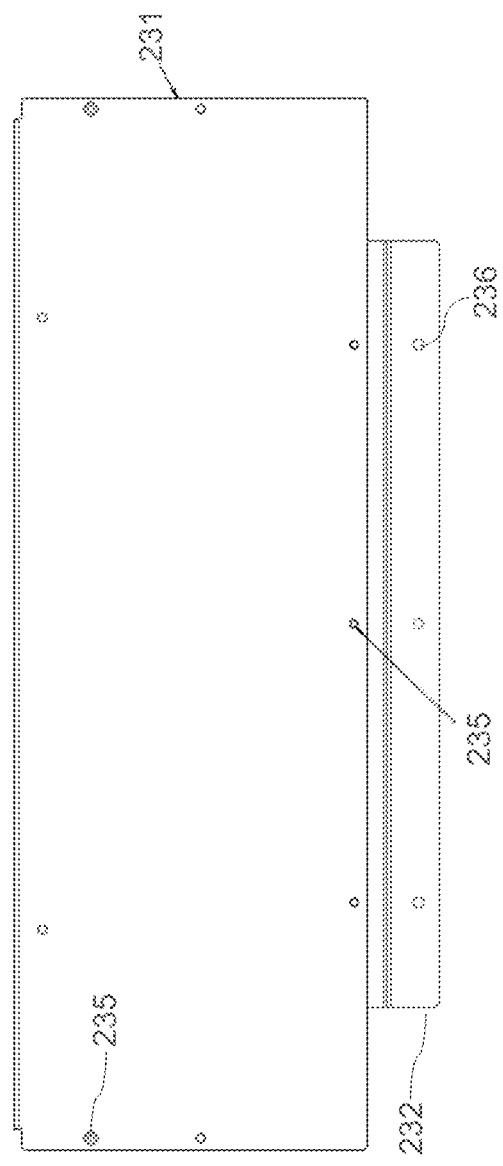

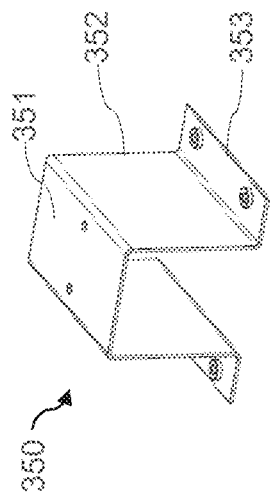
FIG. 8A
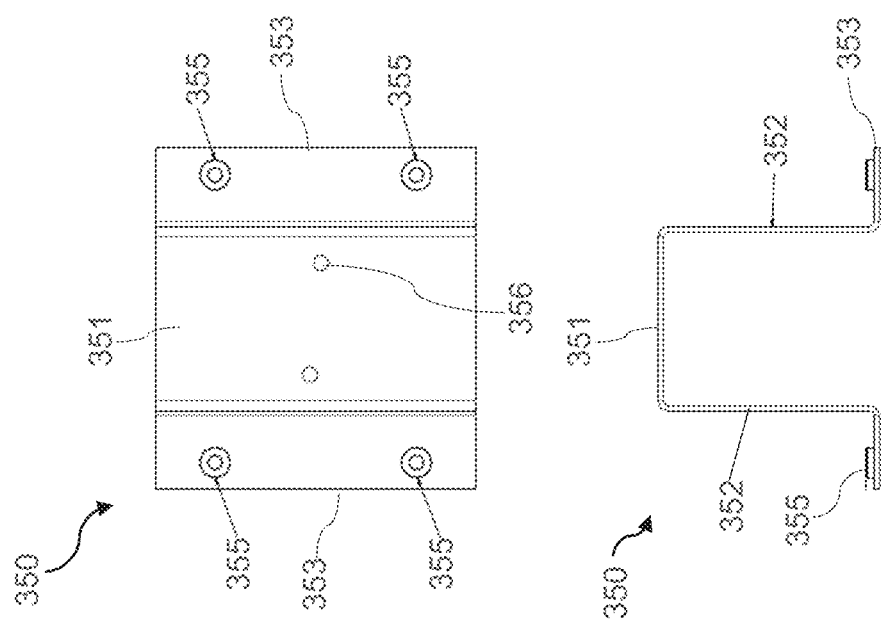
FIG. 8B
FIG. 8C

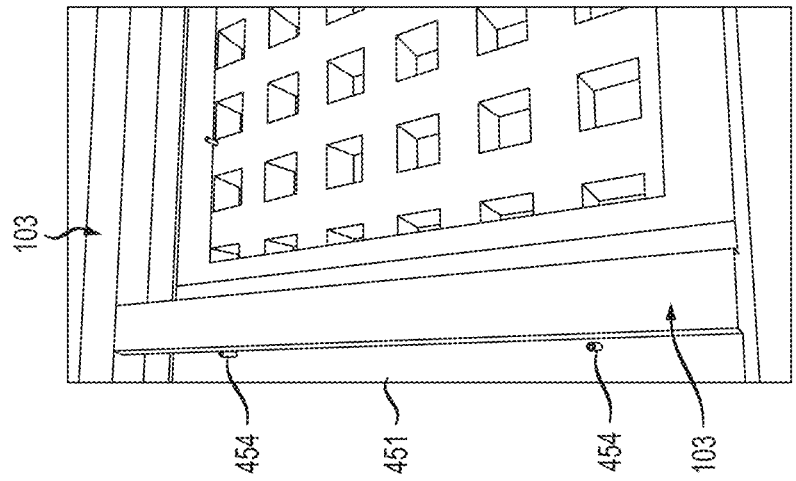
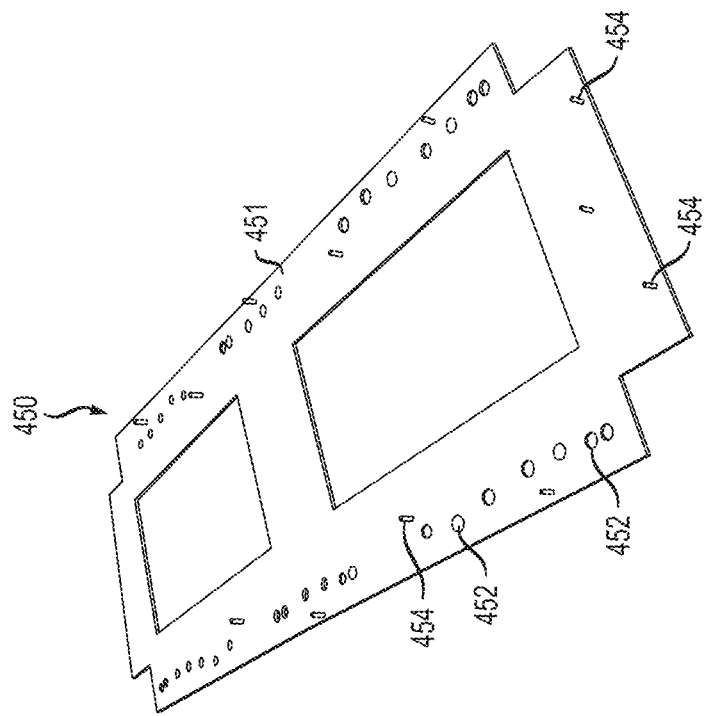

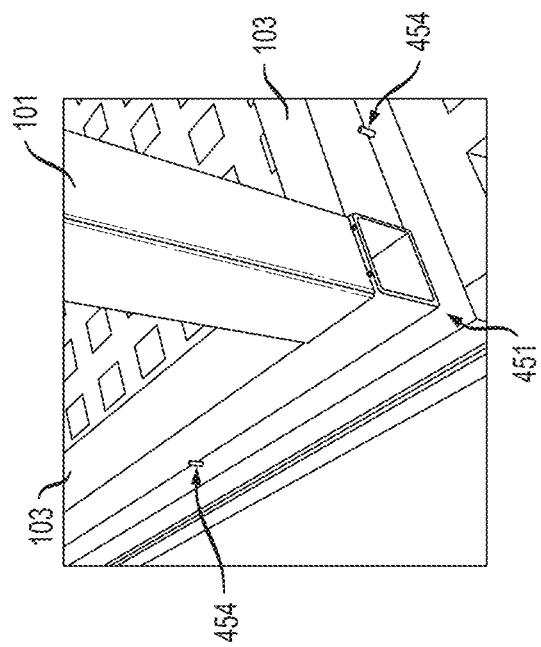
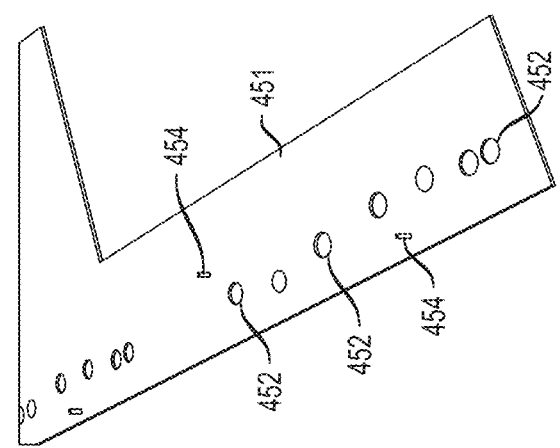

SEISMICALLY FORTIFIED ELECTRONIC EQUIPMENT RACKS

FIELD

The field relates generally to electronic equipment, and more particularly to structures of electronic equipment racks.

BACKGROUND

During a seismic event such as, for example, an earthquake, electronic equipment racks may be subject to accelerations in X, Y and Z directions simultaneously. Conventional electronic equipment racks are typically constructed with thick-walled, open-section frame members. Assembly of the conventional electronic equipment racks requires welding together a multitude of structural members, which demands expensive skilled labor. When such skilled labor is lacking, weld quality may be reduced. Additionally, heat generated during the welding process may have a negative impact on assembly tolerances.

SUMMARY

Illustrative embodiments provide electronic equipment rack structures.

In one embodiment, an electronic equipment rack comprises a frame comprising a plurality of horizontal portions welded to a plurality of vertical portions, and a plurality of weld studs on surfaces of at least one of one or more of the plurality of vertical portions and one or more of the plurality of horizontal portions. One or more additional portions are attached to the frame via one or more of the plurality of weld studs.

Such an arrangement advantageously provides electronic equipment rack structures that utilize closed tube sections joined together through the limited use of welding. In illustrative embodiments, structural members are fastened in place via threaded weld studs, which are easily added to the closed tube sections. Advantageously, the embodiments use less welds relative to conventional open section structures. As an additional advantage, the configurations of the embodiments utilize multiple strengthening gussets, and parts for the electronic equipment racks, such as doors, side panels, front covers, rear covers, roof panels and floor panels, are secured via the weld studs.

These and other embodiments include, without limitation, apparatus, systems and methods.

BRIEF DESCRIPTION OF THE DRAWINGS

FIG. 1B depicts an enlarged image of the circled portion B1 of FIG. 1A in an illustrative embodiment.

FIG. 1C depicts a schematic front view of the electronic equipment rack of FIG. 1A in an illustrative embodiment.

FIG. 1D depicts a schematic side view taken along the line D-D in FIG. 1C in an illustrative embodiment.

FIG. 1E depicts a schematic bottom view taken along the line E-E in FIG. 1C in an illustrative embodiment.

FIG. 2A depicts a schematic perspective view of an electronic equipment rack in an illustrative embodiment.

FIG. 2C depicts a schematic front view of the electronic equipment rack of FIG. 2A in an illustrative embodiment.

FIG. 2D depicts a schematic side view taken along the line D-D in FIG. 2C in an illustrative embodiment.

FIG. 2E depicts a schematic bottom view taken along the line E-E in FIG. 2C in an illustrative embodiment.

FIG. 2F depicts a schematic perspective view of a mounting rail of the electronic equipment rack in FIG. 2A an illustrative embodiment

FIG. 4A depicts a schematic perspective view of an electronic equipment rack with panels attached thereto in an illustrative embodiment.

FIG. 4B depicts a schematic side view of an electronic equipment rack with panels attached thereto in an illustrative embodiment.

FIGS. 5A and 5B depict schematic perspective views of brackets for attaching accessory parts to an electronic equipment racks in an illustrative embodiment.

FIG. 5C depicts an image of electronic equipment rack including the brackets of FIGS. 5A and 5B attached thereto in an illustrative embodiment.

FIG. 5D depicts a schematic perspective view of an electronic equipment rack with mounting rails and panels attached thereto in an illustrative embodiment.

FIG. 5E depicts an enlarged image of the circled portion E of FIG. 5D in an illustrative embodiment.

FIGS. 7A, 7B and 7C depict isometric, front and side views of a rear panel and bracket configured for installation on an electronic equipment rack in an illustrative embodiment.

FIGS. 8A, 8B and 8C depict isometric, top and front views of a bracket for attaching accessory parts to an electronic equipment rack in an illustrative embodiment.

FIG. 11A depicts an image of a jig used for aligning electronic equipment rack tubing during welding and for locating weld studs on the electronic equipment rack tubing in an illustrative embodiment.

FIG. 11B depicts an image of use of the jig in FIG. 11A to align electronic equipment rack tubing during welding in an illustrative embodiment.

FIG. 11C depicts an enlarged image of part of the jig in FIG. 11A in an illustrative embodiment.

FIG. 11D depicts an image of use of the jig in FIG. 11A to align electronic equipment rack tubing during welding in an illustrative embodiment.

DETAILED DESCRIPTION

Illustrative embodiments will be described herein with reference to exemplary electronic equipment rack structures and component configurations installed on the electronic equipment racks. It is to be appreciated, however, that the embodiments are not restricted to the particular illustrative configurations shown. Terms such as "electronic equipment racks" as used herein are intended to be broadly construed, so as to encompass, for example, a wide variety of arrangements of housings for electronic equipment, such as, but not necessarily limited to, chassis and frames, which may be used to house different arrangements of storage drives, processors, servers or other types of computer components and electronic equipment.

Referring to FIGS. 1A-1E, an electronic equipment rack 100-1 comprises a frame, which includes a plurality of horizontal portions 103 welded to a plurality of vertical portions 101. The plurality of horizontal portions 103 and the plurality of vertical portions 101 comprise a closed shape, such that the cross-sections of the horizontal and vertical portions 103 and 101 are a closed shape that has a continuous perimeter without a break or opening. An example closed shape may be a square or rectangle. According to an embodiment the horizontal and vertical portions 103 and 101 comprise closed tubing, such as, but not necessarily limited to, A500 carbon steel tubing. According to embodiments, the length and wall thickness may vary depending on application.

Figure 1A:
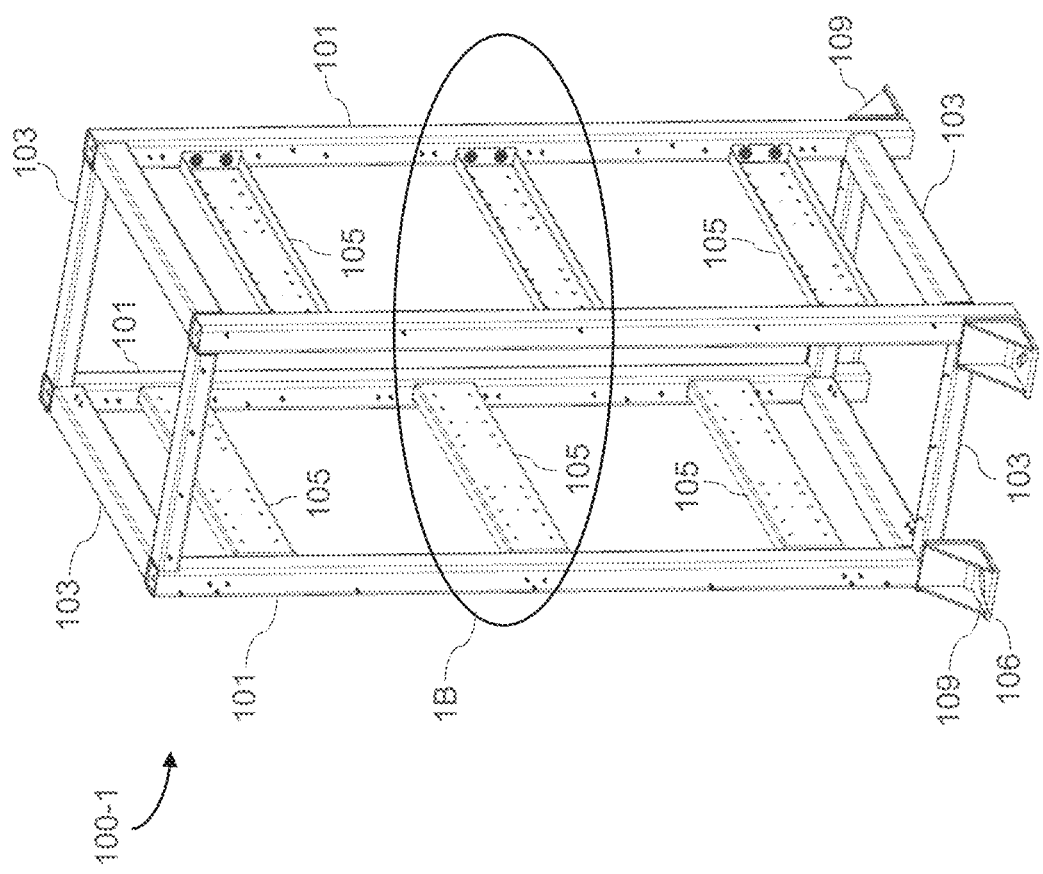
FIG. 1A depicts a schematic perspective view of an electronic equipment rack in an illustrative embodiment.

The horizontal portions 103 are welded to the vertical portions 101 by a seam welding process, where flat surfaces of the horizontal portions 103 are welded to the flat surfaces of the vertical portions 101, which avoids long labor-intensive seams. As shown in FIGS. 1A and 1E, the edges of the horizontal portions 103 are welded to the sides of the vertical portions 101 at or near a top of the vertical portions 101 and at or near a bottom of the vertical portions 101. As shown in FIGS. 1A and 1E, four horizontal portions 103 at the bottom and four horizontal portions at the top of the frame are formed in a square or rectangular shape, with four vertical portions 101 at the corners of the square or rectangular shapes formed by the four horizontal portions 103 at the top of the frame and the four horizontal portions 103 at the bottom of the frame. Alternatively, edges of the horizontal portions 103 can be welded to the sides of adjacent horizontal portions 103 into a square or rectangular shape. In this case, the edges of the vertical portions 101 can be welded to the top or bottom surfaces of the horizontal portions 103 (depending on whether the horizontal portions 103 will be located at top or bottom of the frame) or to outer side surfaces of the horizontal portions 103 to form a frame.

Referring to FIGS. 1A-1E, a plurality of weld studs 110 are on surfaces of the horizontal and vertical portions 103 and 101. According to an embodiment, the plurality of weld studs 110 each comprise a threaded shaft that is welded to a surface of a horizontal portion 103 or vertical portion 101 by capacitor discharge welding with a stud welding gun ("stud gun"). The process of welding a weld stud to a surface of a horizontal portion 103 or vertical portion 101 by capacitor discharge welding may only take milliseconds to complete. According to an embodiment, using a stud gun, the weld stud 110 is placed in contact with a surface of a horizontal or vertical portion 103 or 101. A weld arc melts a base (not shown) of the weld stud 110 and an area of the surface of the horizontal or vertical portion 103 or 101. The threaded shaft of the weld stud 110 protrudes from the base of the weld stud 110. In order to attach the weld stud 110 to the surface of the horizontal or vertical portion 103 or 101, the weld stud 110 is held in place in the melted area until the metals re-solidify. The resulting high quality fusion arc weld is complete in milliseconds. As an alternative to capacitor discharge welding, an arc welding method is used for welding weld studs 110 to surfaces of the horizontal or vertical portions 103 or 101. As an alternative or in addition to weld studs 110, weld nuts comprising a threaded nut on a base can be welded to surfaces of the horizontal and vertical portions 103 and 101 using the same or similar processes as used for welding the weld studs 110.

Referring to FIGS. 1A, 1B and 1D, open-shaped horizontal portions 105 are attached between two vertical portions 101 via one or more of the weld studs 110. The cross-sections of the open-shaped horizontal portions 105 have an open shape that does not have a continuous perimeter. In other words, the perimeter of the open-shaped horizontal portions 105 includes a break or opening. For example, the open-shaped horizontal portions 105 may be formed in a U-shape or other type of open shape with one or more sides or parts of sides omitted. The open-shaped horizontal portions 105 are attached to the vertical portions 101 via fasteners 112 mated with the weld studs 110. For example, the weld studs 110 are inserted through holes in a side of the open-shaped horizontal portions 105 abutting a surface of the vertical portion 101, and a nut is screwed on respective ones of the threaded weld studs 110 inserted through the holes until the open-shaped horizontal portion 105 is fastened to the vertical portion 101. A washer may also be used between the nut and the side of the open-shaped horizontal portion 105 abutting a surface of the vertical portion 101. This process is repeated for multiple sides of the open-shaped horizontal portions 105 and corresponding surfaces of vertical portions 101 until the open-shaped horizontal portions 105 are in place. Although open-shaped horizontal portions 105 are illustrated, additional members in different orientations (e.g., vertical, horizontal or otherwise), as described in more detail herein, can be attached to the vertical and/or horizontal portions 101 and 103 via one or more of the weld studs 110 in a manner similar to the attachment of the open-shaped horizontal portions 105. The open-shaped horizontal portions 105 comprise different sized holes 114 and 115 for receiving different sized fasteners for attaching other support members or portions of electronic equipment housings to the open-shaped horizontal portions 105.

As shown in FIGS. 1A and 1C-1D, the electronic equipment rack 100-1 further includes a plurality of floor brackets 109 attached to sides of the vertical and horizontal portions 101 and 103 at a bottom of the frame of the electronic equipment rack 100-1. Respective rear flat surfaces of the floor brackets 109 are welded to flat surfaces of the vertical and horizontal portions 101 and 103 by a seam welding process. According to an embodiment, each floor bracket 109 comprises a base portion with a hole 106 through the base portion. As explained in more detail in connection with FIGS. 2A and 2E, the hole 106 is configured to receive a fastener 116 such as, for example, a fastener to anchor the floor bracket 109 to an underlying floor structure. The floor bracket 109 further comprises an extension portion extending from the base. The extension portion is perpendicular to the base and comprises the rear flat surface that is welded to flat surfaces of corresponding vertical and horizontal portions 101 and 103. The floor bracket 109 further comprises gussets disposed between the base and the extension portion. The gussets are spaced apart from each other. According to an embodiment, each gusset comprises a triangular shape and is located on a side of the extension portion and extends between the extension portion and the base at acute angles with respect to the base and the extension portion. In one or more embodiments, the gussets are in the shape of a right triangle where the side that extends between the extension portion and the base is a hypotenuse of the right triangle.

The electronic equipment rack 100-2 in FIGS. 2A-2E is similar to the electronic equipment rack 100-1 in FIGS.

Figure 2B:
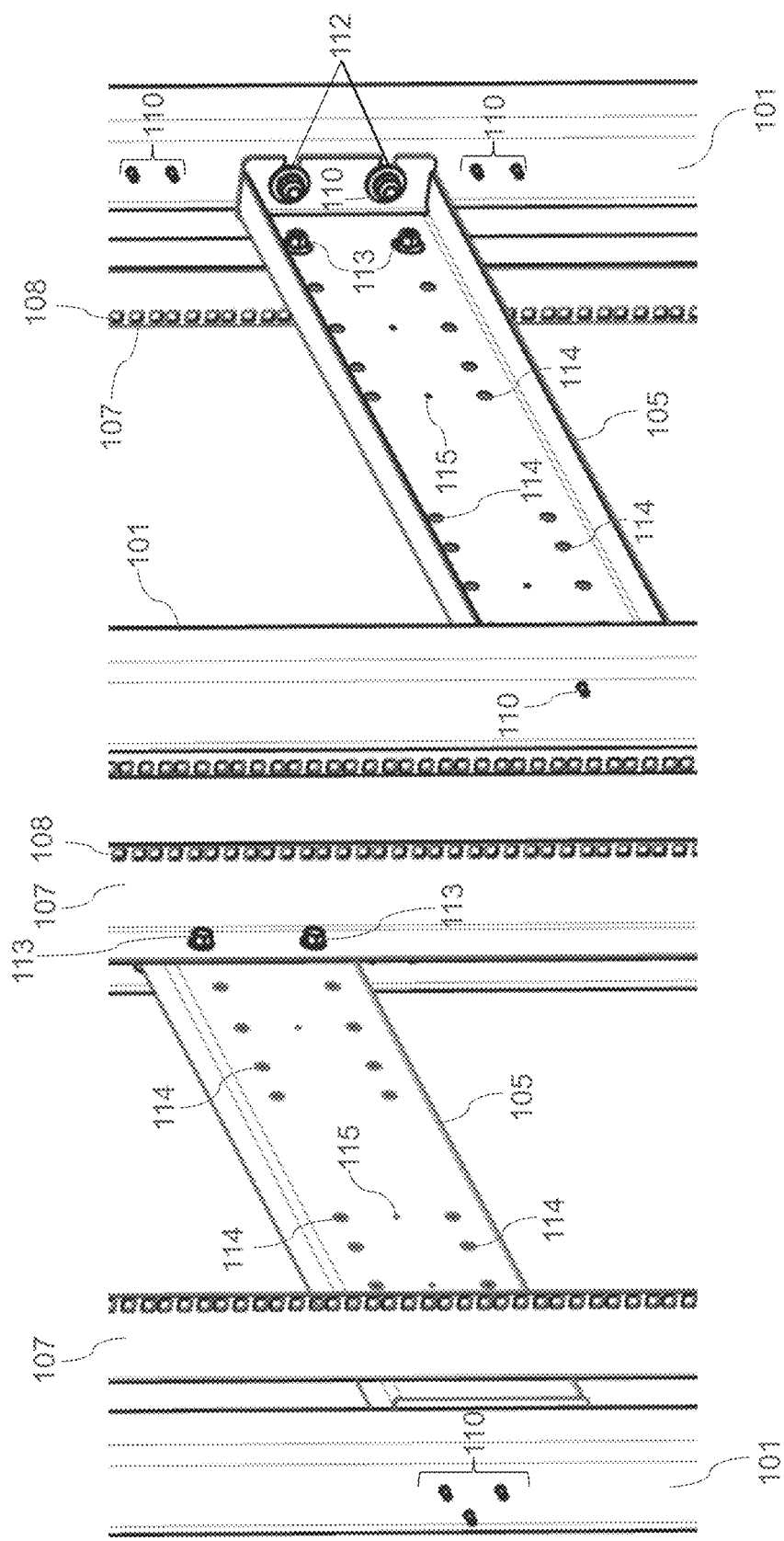
FIG. 2B depicts an enlarged image of the circled portion B2 of FIG. 2A in an illustrative embodiment.

1A-1E. The electronic equipment rack 100-2 includes four electronic equipment mounting rails 107 mounted opposite each other on the open-shaped horizontal portions 105. The electronic equipment mounting rails 107 are positioned at ends of the open-shaped horizontal portions 105 near the vertical portions 101 and are oriented parallel to the vertical portions 101 (and perpendicular to the open-shaped horizontal portions 105). The electronic equipment mounting rails 107 are attached to the open-shaped horizontal portions 105 via fasteners 113 inserted through holes 114 in the open-shaped horizontal portions 105 and holes in the electronic equipment mounting rails 107 (see, e.g., holes 127 in electronic equipment mounting rail 107' in FIG. 2F). The fasteners 113 may comprise bolts with washers and nuts used to secure the electronic equipment rails to the open-shaped horizontal portions 105. Alternatively, the electronic equipment mounting rails 107 can be secured to the vertical and/or horizontal portions 101, 103 directly via the weld studs 110 in the same or similar manner as the open-shaped horizontal portions 105. Referring to FIGS. 2A, 2B and 2D-2F, the electronic equipment mounting rails 107, 107' may comprise an L-shape. For example, referring to the electronic equipment mounting rail 107' in FIG. 2F, the L-shape comprises a first portion 121 and a second portion 122 perpendicular to the first portion. As shown in FIG. 2B, the electronic equipment mounting rail 107 includes a plurality of holes 108 to receive, for example, mounting brackets or fasteners to support electronic equipment mounted to the electronic equipment mounting rails 107. In one or more embodiments, the electronic equipment mounting rails 107/107' may comprise an Electronic Industries Association (EIA) mounting rail. In one or more embodiments, EIA mounting flanges may also be attached to the open-shaped horizontal portions 105 or to the vertical and/or horizontal portions 101, 103 directly via the weld studs 110.

The electronic equipment rack 100-2 in FIGS. 2A and 2E illustrates fasteners 116 inserted through holes 106 in the floor brackets 109 to anchor the floor brackets 109 to an underlying floor structure. Depending on the application, the fasteners 116 may comprise, any combination of screws, bolts, anchor bolts (e.g., concrete anchor bolts), nuts and washers.

Figure 3:
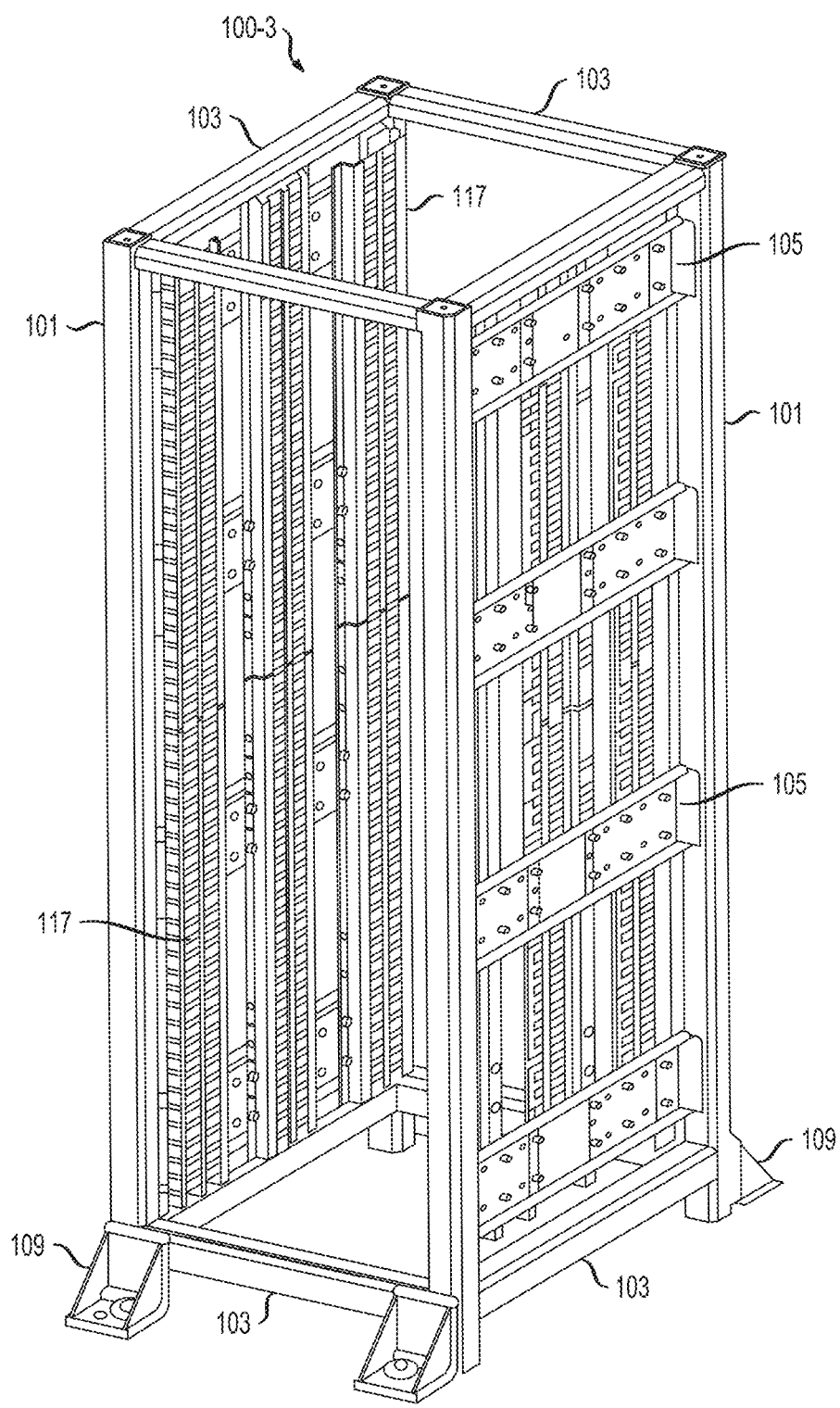
FIG. 3 depicts a schematic perspective view of an electronic equipment rack in an illustrative embodiment.

FIG. 3 illustrates another embodiment of an electronic equipment rack 100-3, which is similar to the electronic equipment racks 100-1 and 100-2. The electronic equipment rack 100-3 is without electronic equipment mounting rails 107, and instead includes another embodiment of electronic equipment mounting rails 117, which are wider and cover more area than the electronic equipment mounting rails 107. The electronic equipment rack 100-3 includes six electronic equipment mounting rails 117 mounted opposite each other on the open-shaped horizontal portions 105. The electronic equipment mounting rails 117 are positioned at a middle portion and at ends of the open-shaped horizontal portions 105 near the vertical portions 101 and are oriented parallel to the vertical portions 101 (and perpendicular to the open-shaped horizontal portions 105). The electronic equipment mounting rails 117 are attached to the open-shaped horizontal portions 105 via fasteners inserted through holes 114 in the open-shaped horizontal portions 105 and holes in the electronic equipment mounting rails 117. The fasteners may comprise bolts with washers and nuts used to secure the electronic equipment rails to the open-shaped horizontal portions 105. Alternatively, the electronic equipment mounting rails 117 can be secured to the vertical and/or horizontal portions 101, 103 directly via the weld studs 110 in the same or similar manner as the open-shaped horizontal portions 105. As shown in FIG. 3, the electronic equipment mounting rails 117 comprise a U-shape with outward extensions from the end of the U-shape comprising holes that can line up with holes 114 in the open-shaped horizontal portions 105 to receive the fasteners to secure the electronic equipment mounting rails 117 to the open-shaped horizontal portions 105. Similar to the electronic equipment mounting rails 107, the electronic equipment mounting rails 117 include a plurality of holes to receive, for example, mounting brackets or fasteners to support electronic equipment mounted to the electronic equipment mounting rails 117.

Referring to FIGS. 4A, 4B and 6-7C, a loaded electronic equipment rack 200 comprises a plurality of elements added to the unloaded versions of the electronic equipment racks 100-1, 100-2 or 100-3. For example, the loaded electronic equipment rack 200 comprises a front panel 203 on a front cover portion 202, a front face plate 204, a roof panel 208, side panels 210, a rear cover portion 212 and a rear panel 231 on the rear cover portion 212. The front panel 203 may comprise a door which can be opened and closed to provide access to electronic equipment in the loaded electronic equipment rack 200. In one or more embodiments, the front cover portion 202, front face plate 204, roof panel 208, side panels 210, rear cover portion 212 and a floor panel (not shown) may be attached to the frames of the electronic equipment racks 100-1, 100-2 or 100-3 via, for example, one or more of the plurality of weld studs 110 on the vertical and/or horizontal portions 101 and 103. Attachment of the floor panel and of elements 202, 204, 208, 210 and 212 to the surfaces of the vertical and/or horizontal portions 101 and 103 via the weld studs 110 can be performed using fasteners in a similar manner to that of attachment of the open-shaped horizontal portions 105 and electronic equipment mounting rails 107, 107' and 117 via the weld studs 110. For example, the weld studs 110 can be inserted through the holes 216 in the roof and side panels 208 and 210 and/or through the holes 225 in the front face plate 204 so that the roof and side panels 208 and 210 and/or the front face plate 204 can be fastened to the vertical or horizontal portions 101 or 103 using washers and nuts screwed onto the weld studs 110 penetrating through the holes 216 and/or 225.

Alternatively, depending on the orientation of the floor panel and of elements 202, 204, 208, 210 and 212 in relation to the surfaces of the vertical and/or horizontal portions 101 and 103 and corresponding weld studs 110, one or more interface brackets may be used to mount the floor panel and/or elements 202, 204, 208, 210 and 212. For example, referring to FIGS. 5A-5E, interface brackets 330 and 340 can be attached to a surface of a vertical portion 101 via weld studs 110 on the surface of the vertical portion 101, and the side panels 210 can be attached to the interface brackets 330 and 340. In more detail, the interface bracket 330 comprises a first portion 331 and a second portion 332 perpendicular to the first portion 331. Referring to FIGS. 5A, 5D and 5E, the first portion includes a plurality of holes 333 configured to receive respective ones of the weld studs 110, so that the interface bracket 330 can be fastened to the vertical portion 101 using washers and nuts screwed onto the weld studs 110 penetrating through the holes 333. Referring to FIGS. 5D and 5E, the holes 333 on the first portion 331 line up with and receive the weld studs 110 on the vertical portion 101 therethrough. Referring to FIG. 5C, the hole 334 on the second portion 332 lines up with a hole 216 in a side panel. Fasteners can be inserted through the holes 216 and 334 to secure the side panel 210 to the interface bracket 330. FIG. 5C also depicts a vertical support bracket 321 for side panels 210.

The interface bracket 340 comprises a first portion 341 and a second portion 342 perpendicular to the first portion 341. The first portion includes a plurality of holes 343 configured to receive respective ones of the weld studs 110, so that the interface bracket 340 can be fastened to the vertical portion 101 using washers and nuts screwed onto the weld studs 110 penetrating through the holes 343. The holes 344 in the second portion 342, which is shown in FIG. 5C, line up with holes 216 in a side panel 210. Fasteners can be inserted through the holes 216 and 344 to secure the side panel 210 to the interface bracket 340. The interface bracket 340 further includes gussets 345 to provide further support for elements attached to the interface bracket 340. The interface brackets 330 and 340 are not limited use on the vertical portions 101 or with the side panels 210. The interface brackets 330 and 340 can be attached to horizontal portions 103 in a similar manner to their attachment to vertical portions 101, and to other elements (e.g., elements 202, 204, 208 and 212) in a similar manner to their attachment to side panels 210.

Referring to FIGS. 8A-10, other interface brackets that can be used to attach elements to the vertical and/or horizontal portions 101 and 103 comprise, for example, interface brackets 350, 360 and 370. The interface bracket 350 comprises a U-shape with a base portion 351 comprising holes 356, two opposing side portions 352 and respective extension portions 353 extending perpendicularly from the side portions 352. The extension portions 353 comprise holes 355. According to an embodiment, the interface bracket 350 is attached to a surface of a vertical portion 101 or of a horizontal portion 103 by inserting weld studs 110 through the holes 355 so that the interface bracket 350 can be fastened to the vertical or horizontal portions 101 or 103 using washers and nuts screwed onto the weld studs 110 penetrating through the holes 355. The holes 356 in the base portion 351 can be lined up with holes in the elements to be attached to the interface bracket 350 (e.g., holes 216, 225, 226, 235 and 236). Fasteners can be inserted through the holes in the elements to be attached and the holes 356 to secure the elements to the interface bracket 350. Alternatively, in a different orientation, the interface bracket 350 is attached to a surface of a vertical portion 101 or of a horizontal portion 103 by inserting weld studs 110 through the holes 356 so that the interface bracket 350 can be fastened to the vertical or horizontal portions 101 or 103 using washers and nuts screwed onto the weld studs 110 penetrating through the holes 356. The holes 355 in the extension portions 353 can then be lined up with holes in the elements to be attached to the interface bracket 350, and fasteners can be inserted through the holes in the elements to be attached and the holes 355 to secure the elements to the interface bracket 350.

The interface bracket 360 comprises a base portion 361 with two opposing side portions 362 and 363 extending perpendicularly from the base portion 361 and gussets 364 between the two opposing side portions 362 and 363. The two opposing side portions 362 and 363 extend to different heights above the base portion 361. The side portion 362 comprises holes 365 and the side portion 363 comprises holes 366. According to an embodiment, the interface bracket 360 is attached to a surface of a vertical portion 101 or of a horizontal portion 103 by inserting weld studs 110 through the holes 365 so that the interface bracket 360 can be fastened to the vertical or horizontal portions 101 or 103 using washers and nuts screwed onto the weld studs 110 penetrating through the holes 365. The holes 366 in the side portion 363 can be lined up with holes in the elements to be attached to the interface bracket 360 (e.g., holes 216, 225, 226, 235 and 236). Fasteners can be inserted through the holes in the elements to be attached and the holes 366 to secure the elements to the interface bracket 360. Alternatively, in a different orientation, the interface bracket 360 is attached to a surface of a vertical portion 101 or of a horizontal portion 103 by inserting weld studs 110 through the holes 366 so that the interface bracket 360 can be fastened to the vertical or horizontal portions 101 or 103 using washers and nuts screwed onto the weld studs 110 penetrating through the holes 366. The holes 365 in the side portion 362 can then be lined up with holes in the elements to be attached to the interface bracket 360, and fasteners can be inserted through the holes in the elements to be attached and the holes 365 to secure the elements to the interface bracket 360.

The interface bracket 370 comprises a first portion 371 comprising holes 375 and a second portion 372 extending perpendicular from an edge of the first portion and comprising holes 376. Two gusset portions 373 extend perpendicularly from left and right ends of the second portion 372. According to an embodiment, the interface bracket 370 is attached to a surface of a vertical portion 101 or of a horizontal portion 103 by inserting weld studs 110 through the holes 375 so that the interface bracket 370 can be fastened to the vertical or horizontal portions 101 or 103 using washers and nuts screwed onto the weld studs 110 penetrating through the holes 375. The holes 376 in the second portion 372 can be lined up with holes in the elements to be attached to the interface bracket 370 (e.g., holes 216, 225, 226, 235 and 236). Fasteners can be inserted through the holes in the elements to be attached and the holes 376 to secure the elements to the interface bracket 370. The gusset portions 373 can wrap around edges of the attached elements. Alternatively, in a different orientation, the interface bracket 370 is attached to a surface of a vertical portion 101 or of a horizontal portion 103 by inserting weld studs 110 through the holes 376 so that the interface bracket 370 can be fastened to the vertical or horizontal portions 101 or 103 using washers and nuts screwed onto the weld studs 110 penetrating through the holes 376. The gusset portions 373 can wrap around edges of the vertical or horizontal portions 101 or 103. The holes 375 in the first portion 371 can then be lined up with holes in the elements to be attached to the interface bracket 370, and fasteners can be inserted through the holes in the elements to be attached and the holes 375 to secure the elements to the interface bracket 370.

Figure 6:
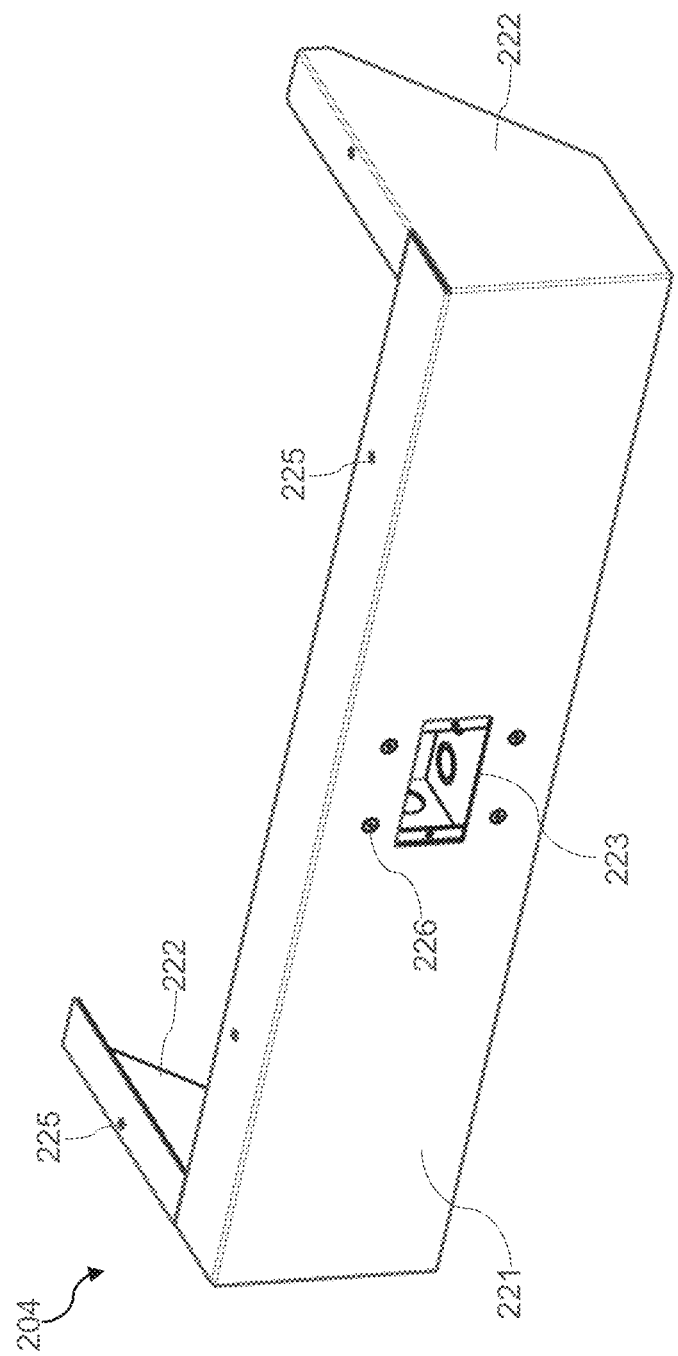
FIG. 6 depicts a schematic perspective view of a front face plate configured for installation on an electronic equipment rack in an illustrative embodiment.
Figure 9:
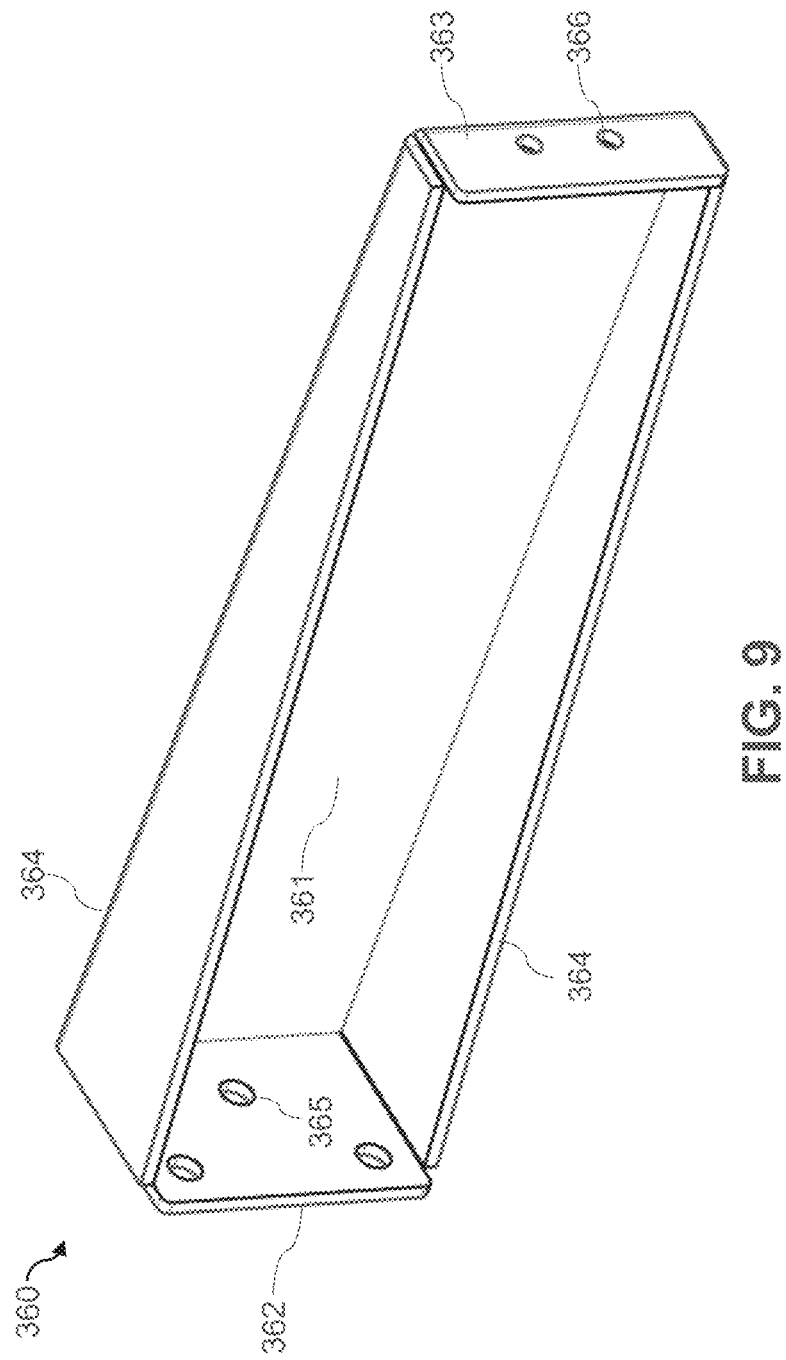
FIG. 9 depicts a schematic perspective view of a bracket for attaching accessory parts to an electronic equipment rack in an illustrative embodiment.
Figure 10:
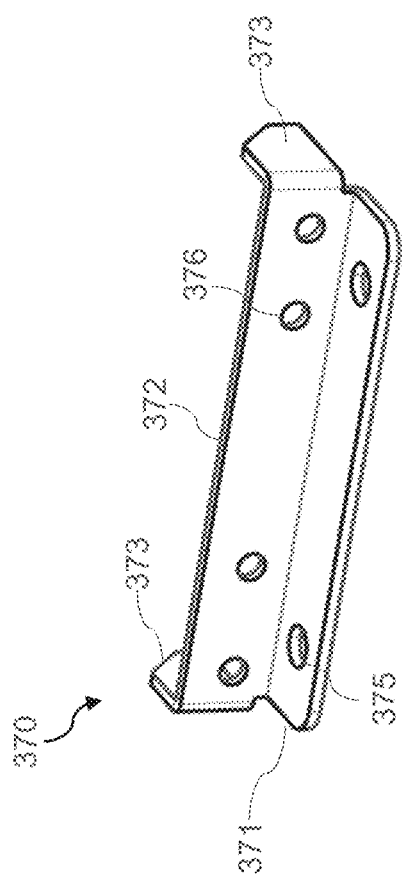
FIG. 10 depicts a schematic perspective view of a bracket for attaching accessory parts to an electronic equipment rack in an illustrative embodiment.

Referring back to FIGS. 4A, 4B and 6-7C, the side panels 210 include handles 206, which can be used to grab the loaded electronic equipment rack 200 when the loaded electronic equipment rack 200 needs to be moved. As shown in FIG. 6, the front face plate 204 includes a face portion 221 and two side portions 222 extending from left and right edges of the face portion and angled to fit around the floor brackets 109. The front face plate 204 includes an opening 223 through which electronic equipment cables (e.g., power and data cables) can be routed into and out of the loaded electronic equipment rack 200. In addition, the front face plate 204 comprises holes 225 and 226 which can receive weld studs 110 and/or fasteners for interface brackets (e.g., interface brackets 330-370) to directly or indirectly attach the front face plate 204 to the vertical and/or horizontal portions 101 and 103.

Referring to FIGS. 7A-7C, the rear panel 231 includes holes 235. A z-shaped interface bracket 232 comprising holes 236 and 237 can be used to attach the rear panel to the vertical and/or horizontal portions 101 and 103. According to an embodiment, the interface bracket 232 is attached to a surface of a vertical portion 101 or of a horizontal portion 103 by inserting weld studs 110 through the holes 236 on one side of the interface bracket 232 so that the interface bracket 232 can be fastened to the vertical or horizontal portions 101 or 103 using washers and nuts screwed onto the weld studs 110 penetrating through the holes 236. Holes 237 on another side of the interface bracket 232 can be lined up with holes 235 rear panel 231 to be attached to the interface bracket 232. Fasteners can be inserted through the holes 235 and the holes 237 to secure the rear panel 231 to the interface bracket 232.

Referring to FIGS. 11A-11D, when welding horizontal portions 103 to vertical portions 101 or horizontal portions 103 to each other, a jig 450 can be used to the properly position the vertical and horizontal portions 101 and 103 prior to and during welding. For example, respective horizontal portions 103 can be positioned between alignment studs 454 on the jig 450. In addition, when welding the weld studs 110 to the vertical and horizontal portions 101 and 103, the positions of the weld studs 110 on the surfaces of the vertical portions 101 and the horizontal portions 103 set to correspond to locations of a plurality holes 452 in the jig 451 configured to receive a tip of a stud gun. In more detail, the jig 451 is lined up with the vertical or horizontal portions 101 or 103 using, for example, the alignment studs 454, and corresponding locations of holes 452 on the surfaces of the vertical or horizontal portions 101 or 103 are used to position a stud gun at desired locations of the weld studs 110. Using the stud gun, the weld studs 110 are added to the surfaces of the vertical and horizontal portions 101 and 103 at the locations of the holes 452. In one or more embodiments, the jig 450 is comprised of sheet metal or other appropriate material.

Fasteners described herein may include, for example, drop pins, screws, bolts, nuts, washers and/or lock washers. In addition to the materials noted herein, the materials of the vertical and horizontal portions 101 and 103, open-shaped horizontal portions 105, electronic equipment mounting rails 107, 107' and 117, floor brackets 109, weld studs 110, front cover portion 202, front panel 203, front face plate 204, roof panel 208, side panel 210, rear cover portion 212, rear panel 231, and interface brackets 232, 330, 340, 350, 360 and 370 include, but are not necessarily limited to, stainless steel, carbon steel, aluminum, copper, bronze, brass, galvanized steel or alloys thereof (e.g., 304 and 304L ASTM A240 stainless steel plate, ASTM A500, A551 carbon steel). The number of weld studs, holes and fasteners described herein may vary.

The embodiments advantageously provide a seismically hardened electronic equipment rack constructed with closed tube sections joined together through the limited use of welding, and including structural members fastened in place via threaded weld studs. Closed-shaped tube portions are optimized in size and wall thickness depending on their location within the framework of the electronic equipment rack. The tube sections are welded along flat surfaces thereof to intersecting tubes to avoid labor-intensive seams. The embodiments advantageously use less welds than conventional open section structures.

As an additional advantage, the weld studs are installed using a stud gun implementing capacitor discharge welding, which requires only milliseconds to seconds to complete. The threaded weld studs are located within the framework using an external jig that eliminates the tolerances accumulated during welding. The jig comprises a flat metal plate with a pattern of cut holes that locate the tip of the stud gun for each stud location. Additional parts, such as doors, side panels, and other panels are secured on the weld studs. High tolerance parts such as, for example, information technology (IT) gear mounting flanges and rails are located via one or more fixtures and can be fastened to the weld studs.

The attachment of structural elements via weld studs minimizes time, labor and assembly tolerances. Drilled holes into frame elements for fasteners, which compromise the strength of the elements, are reduced. In addition, the use of the weld studs allows for easy reconfiguration of non-structural parts to accommodate multiple electronic equipment rack designs. Further, the embodiments satisfy Network Equipment Building System (NEBS) earthquake requirements with a high weight uniformly distributed IT-payload.

The arrangements shown in the illustrative embodiments of FIGS. 1A through 11D are presented by way of example for purposes of illustration only, and alternative embodiments can utilize a wide variety of other types of electronic equipment rack and weld stud configurations. Accordingly, the particular configurations of components as shown in the figures can be varied in other embodiments. Moreover, the various assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. An electronic equipment rack comprising:
   a frame comprising a plurality of horizontal portions welded to a plurality of vertical portions;
   a plurality of weld studs on surfaces of at least one of one or more of the plurality of vertical portions and one or more of the plurality of horizontal portions;
   one or more additional portions attached to the frame via one or more of the plurality of weld studs; and
   a plurality of floor brackets attached to at least one of respective ones of the plurality of horizontal portions and respective ones of the plurality of vertical portions;
   wherein the one or more additional portions comprise at least one panel comprising one or more holes through which the one or more of the plurality weld studs are inserted; and
   wherein the at least one panel is shaped to fit around one or more of the plurality of floor brackets.

2. The electronic equipment rack of claim 1 wherein the plurality of horizontal portions and the plurality of vertical portions comprise a closed shape.

3. The electronic equipment rack of claim 2 wherein a subset of the one or more additional portions comprise an open shape.

4. The electronic equipment rack of claim 1 wherein the one or more additional portions are attached to the frame via one or more fasteners mated with the one or more of the plurality of weld studs.

5. The electronic equipment rack of claim 1 wherein the plurality of horizontal portions are arranged in one of a rectangular shape and a square shape, and wherein the respective ones of the plurality of vertical portions are positioned at corners of one of the rectangular shape and the square shape.

6. The electronic equipment rack of claim 5 wherein the plurality of horizontal portions are positioned one of at and adjacent a top and a bottom of the frame.

7. The electronic equipment rack of claim 1 wherein the plurality of weld studs are threaded.

8. The electronic equipment rack of claim 1 wherein the one or more additional portions further comprise at least one of a mounting flange and a mounting rail.

9. The electronic equipment rack of claim 1 wherein the at least one panel comprises a bottom panel, and wherein the one or more additional portions further comprise at least one of a door, a side panel, a front cover, a rear cover and a top panel for the electronic equipment rack.

10. The electronic equipment rack of claim 1 wherein the one or more additional portions further comprise a first additional portion comprising a bracket configured to be attached to one of a horizontal portion of the plurality of horizontal portions and a vertical portion of the plurality of horizontal portions and second additional portion configured to be attached to the bracket.

11. A method comprising:
welding a plurality of horizontal portions to a plurality of vertical portions;
welding a plurality of weld studs to surfaces of at least one of one or more of the plurality of vertical portions and one or more of the plurality of horizontal portions;
attaching one or more additional portions to at least one of the one or more of the plurality of vertical portions and the one or more of the plurality of horizontal portions via one or more of the plurality of weld studs; and
attaching a plurality of floor brackets to at least one of respective ones of the plurality of horizontal portions and respective ones of the plurality of vertical portions;
wherein the one or more additional portions comprise at least one panel comprising one or more holes through which the one or more of the plurality weld studs are inserted; and
wherein the at least one panel is shaped to fit around one or more of the plurality of floor brackets.

12. The method of claim 11 wherein the welding of the plurality of horizontal portions to the plurality of vertical portions comprises seam welding flat surfaces of the plurality of horizontal portions to flat surfaces of the plurality of vertical portions.

13. The method of claim 12 wherein the welding of the plurality of horizontal portions to the plurality of vertical portions further comprises aligning at least one of the respective ones of the plurality of horizontal portions and the respective ones of the plurality of vertical portions with one or more alignment elements on a jig.

14. The method of claim 11 wherein the welding of the plurality of weld studs comprises capacitor discharge welding the plurality of weld studs to surfaces of at least one of the one or more of the plurality of vertical portions and the one or more of the plurality of horizontal portions.

15. The method of claim 14 wherein the welding of the plurality of weld studs further comprises positioning the plurality of weld studs on the surfaces of at least one of the one or more of the plurality of vertical portions and the one or more of the plurality of horizontal portions to correspond with a plurality of location elements on a jig.

16. The method of claim 15 wherein the plurality of location elements comprise a plurality of holes in the jig configured to receive a tip of a stud welding gun.

17. The method of claim 11 wherein the plurality of weld studs are threaded and wherein the attaching of the one or more additional portions comprises mating one or more fasteners with the one or more of the plurality of weld studs.

18. An electronic equipment rack comprising:
a frame comprising a plurality of closed shape horizontal portions welded to a plurality of closed shape vertical portions;
a plurality of weld studs on surfaces of at least one of the plurality of closed shape vertical portions and the plurality of closed shape horizontal portions;
one or more electronic equipment mounting rails and one or more additional portions attached to the frame via one or more fasteners mated with one or more of the plurality of weld studs; and
a plurality of floor brackets attached to at least one of respective ones of the plurality of closed shape horizontal portions and respective ones of the plurality of closed shape vertical portions;
wherein the one or more additional portions comprise at least one panel comprising one or more holes through which the one or more of the plurality weld studs are inserted; and
wherein the at least one panel is shaped to fit around one or more of the plurality of floor brackets.

19. The electronic equipment rack of claim 18 wherein the plurality of closed shape horizontal portions are arranged in one of a rectangular shape and a square shape, and wherein the respective ones of the plurality of closed shape vertical portions are positioned at corners of one of the rectangular shape and the square shape.

20. The electronic equipment rack of claim 19 wherein the plurality of closed shape horizontal portions are positioned one of at and adjacent a top and a bottom of the frame.

* * * * *